United States Patent
Park et al.

(10) Patent No.: US 8,927,310 B2
(45) Date of Patent: Jan. 6, 2015

(54) METHOD OF FABRICATING PATTERNED SUBSTRATE

(71) Applicant: Samsung Corning Precision Materials Co., Ltd., Gumi-si, Gyeongsangbuk-do (KR)

(72) Inventors: Jeong Woo Park, Asan-si (KR); Yoon Young Kwon, Asan-si (KR); Kyungwook Park, Asan-si (KR); Young Zo Yoo, Asan-si (KR)

(73) Assignee: Samsung Corning Precision Materials Co., Ltd., Gumi-Si, Gyeongsangbuk-Do (KR)

( * ) Notice: Subject to any disclaimer, the term of this patent is extended or adjusted under 35 U.S.C. 154(b) by 0 days.

(21) Appl. No.: 14/048,772

(22) Filed: Oct. 8, 2013

(65) Prior Publication Data

US 2014/0106491 A1    Apr. 17, 2014

(30) Foreign Application Priority Data

Oct. 12, 2012  (KR) .......................... 10-2012-0113235

(51) Int. Cl.
*H01L 21/302*  (2006.01)
*H01L 21/461*  (2006.01)
*H01L 51/00*  (2006.01)
*H01L 51/44*  (2006.01)
*H01L 51/52*  (2006.01)

(52) U.S. Cl.
CPC .......... *H01L 21/302* (2013.01); *H01L 51/0017* (2013.01); *H01L 51/0023* (2013.01); *H01L 51/0096* (2013.01); *H01L 51/447* (2013.01); *H01L 51/5268* (2013.01); *Y02E 10/549* (2013.01)
USPC ............... 438/46; 438/93; 438/694; 438/702; 438/703

(58) Field of Classification Search
USPC ............................ 438/22–99, 694, 702, 703
See application file for complete search history.

(56) References Cited

U.S. PATENT DOCUMENTS

2013/0005060 A1*  1/2013  Lo et al. .......................... 438/29

\* cited by examiner

*Primary Examiner* — Daniel Shook
(74) *Attorney, Agent, or Firm* — McDermott Will Emery LLP

(57) ABSTRACT

A method of fabricating a patterned substrate, with which the optical performance of a photovoltaic cell including an organic solar cell and an organic light-emitting diode (OLED) can be improved. The method includes generating electrostatic force on a surface of a substrate by treating the substrate with electrolytes, causing nano-particles to be adsorbed on the surface of the substrate, etching the surface of the substrate using the nano-particles as an etching mask, and removing the nano-particles residing on the surface of the substrate.

12 Claims, 6 Drawing Sheets

(a)  (b)

Light incident (a)  (b)

METHOD OF FABRICATING PATTERNED SUBSTRATE

CROSS REFERENCE TO RELATED APPLICATION

The present application claims priority from Korean Patent Application Number 10-2012-0113235 filed on Oct. 12, 2012, the entire contents of which are incorporated herein for all purposes by this reference.

BACKGROUND OF THE INVENTION

1. Field of the Invention

The present invention relates to a method of fabricating a patterned substrate, and more particularly, to a method of fabricating a patterned substrate, with which the optical performance of a photovoltaic cell including an organic solar cell and an organic light-emitting diode (OLED) can be improved.

2. Description of Related Art

Next-generation technologies and products that are currently in the spotlight include organic photonic devices based on an organic material. For instance, organic light emitting diodes (OLEDs) which are applied in mobile displays and solid state lighting (SSL) and organic solar cells which employ an organic material as an absorbing layer are typical of organic photonic devices. In these devices, at present, organic materials having high levels of performance are being developed since studies have been concentrated to organic materials.

However, in order to construct such an organic photonic device, it is necessary to combine an organic material with an inorganic material. Typical inorganic materials used in an organic photonic device include a transparent electrode, a metal reflector electrode, a glass substrate and the like. In particular, a transparent inorganic material causes a large amount of light loss due to different refractive indices or the like. This consequently leads to a significant obstacle to the improvement in light efficiency.

For these reasons, while the development of a new organic material is important, continuous research and development for improving the light efficiency of inorganic materials is also required.

The information disclosed in the Background of the Invention section is provided only for better understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a method of fabricating a patterned substrate, with which the optical performance of a photovoltaic cell including an organic solar cell and an organic light-emitting diode (OLED) can be improved.

In an aspect of the present invention, provided is a method of fabricating a patterned substrate of a photovoltaic cell or an organic light emitting diode. The method includes the steps of: generating electrostatic force on a surface of a substrate by treating the substrate with electrolytes; causing nano-particles to be adsorbed on the surface of the substrate; etching the surface of the substrate using the nano-particles as an etching mask; and removing the nano-particles residing on the surface of the substrate.

According to an exemplary embodiment of the invention, the step of treating the substrate with the electrolytes may include: a first step of submerging the substrate into a solution in which a positively-charged first electrolyte is dissolved and then rinsing the substrate; after the first step, a second step of submerging the substrate into a solution in which a negatively-charged second electrolyte is dissolved and then rinsing the substrate; and after the second step, a third step of submerging the substrate into a solution in which a positively-charged third electrolyte is dissolved and then rinsing the substrate.

Here, each of the first electrolyte, the second electrolyte and the third electrolyte may be implemented as an organic material that dissolves into a water solution.

In particular, the first electrolyte and the third electrolyte may be polyallylamine hydrochloride (PAH), and the second electrolyte may be polystyrene sulfonate (PSS).

In addition, the first electrolyte, the second electrolyte and the third electrolyte may be dissolved in a NaCl solution.

In addition, the step of treating the substrate with the electrolyte may further include a fourth step of drying the substrate after the third step.

Furthermore, the step of causing the nano-particles to be adsorbed may include submerging the substrate into a solution in which the nano-particles are dispersed; and taking the substrate out of the solution and the drying the substrate.

In addition, the nano-particles may be made of one of oxide-based materials, such as $SiO_2$, $TiO_2$ and $Nb_2O_3$, or a polymeric material.

Furthermore, the surface of the substrate may be treated with oxygen plasma before generating the electrostatic force.

In addition, the substrate may be implemented as one selected from the group consisting of a transparent conductive oxide substrate, a sapphire substrate, a gallium nitride substrate and a glass substrate.

In an aspect of the present invention, provided is a method of fabricating a photovoltaic cell, the method comprising forming a pattern on a surface of at least one of an electrode substrate and a glass substrate of the photovoltaic cell using the method of fabricating a patterned substrate.

In an aspect of the present invention, provided is a method of fabricating an organic light emitting diode comprising forming a pattern on a surface of at least one of a glass substrate, an internal light extraction substrate and an external light extraction substrate of the organic light emitting diode using the method of fabricating a patterned substrate.

According to embodiments of the present invention, since the surface of a substrate is treated with electrolytes, nano-particles are adsorbed on the surface of the substrate, and the surface of the substrate is patterned using the adsorbed nano-particles as an etching mask. When the patterned substrate is applied for a transparent electrode substrate of an organic photovoltaic cell or a light extraction substrate of an organic light-emitting diode (OLED), the light efficiency of an organic photonic device to which the substrate is applied can be improved.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
FIG. 1 to FIG. 8 are schematic views sequentially showing the processes of a method of fabricating a patterned substrate according to an embodiment of the present invention.

Reference will now be made in detail to a method of fabricating a patterned substrate according to the present invention, embodiments of which are illustrated in the accompanying drawings and described below, so that a person having ordinary skill in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

The method of fabricating a patterned substrate according to an embodiment of the present invention is the method of fabricating a substrate having a patterned surface which is applicable for a transparent electrode substrate of a photovoltaic cell including an organic solar cell or a light extraction cell of an organic light-emitting diode (OLED).

As shown in FIG. 1, in the method of fabricating a patterned substrate according to an embodiment of the present invention includes, first, a substrate 100 is prepared. The substrate 100 can be implemented as one selected from among a transparent conductive oxide (TCO) substrate, a sapphire substrate, a gallium nitride (GaN) substrate and a glass substrate. The TCO substrate can be made of indium tin oxide (ITO), zinc oxide (ZnO) or the like. The substrate 100 can be a deposit on a base (not shown). The base (not shown) can be made of a material that has superior light transmittance and superior mechanical properties, for example, a polymeric material such as a thermally curable or ultraviolet (UV) curable organic film or a chemically toughened glass such as soda-lime glass ($SiO_2$—$CaO$—$Na_2O$) or aluminosilicate glass ($SiO_2$—$Al_2O_3$—$Na_2O$). In addition, the substrate can be deposited on the base (not shown) by sputtering or chemical vapor deposition (CVD). When the substrate 100 according to an embodiment of the present invention is a glass substrate, the base (not shown) can be used as the substrate 100.

Afterwards, the prepared substrate 100 is treated with electrolytes. The substrate 100 is treated with electrolytes in order to generate electrostatic force on the surface of the substrate 100, whereby nano-particles (130 in FIG. 5) can be adsorbed on the surface of the substrate 100 via electrostatic attractive force in the subsequent process. According to an embodiment of the present invention, it is possible to generate electrostatic attractive force by giving opposite charges to the substrate 100 and the electrolytes.

According to an embodiment of the present invention, the surface of the substrate 100 can be treated with oxygen ($O_2$) plasma before being treated with electrolytes. When the surface of the substrate 100 is treated with oxygen plasma, the surface of the substrate 100 becomes abundant with oxygen, such that the surface of the substrate 100 becomes more negatively charged.

Figure 2:
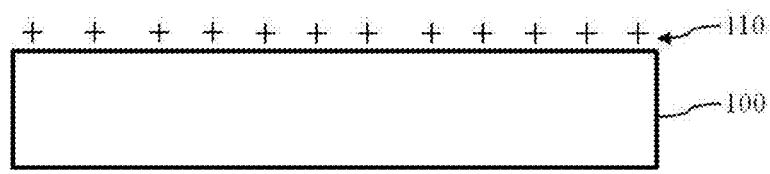
Figure 9:
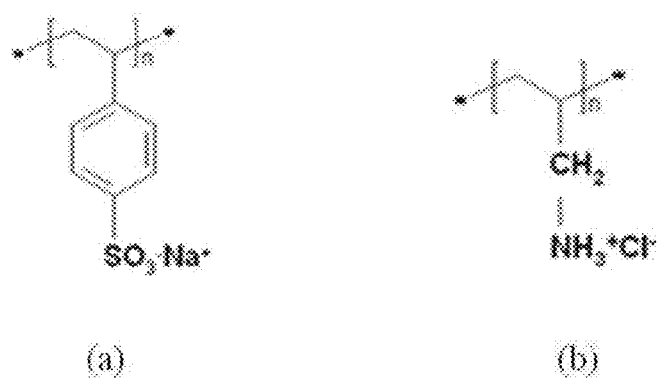
FIG. 9 is a view showing the chemical structures of electrolytes used in the method of fabricating a patterned substrate according to an embodiment of the present invention.

After that, as shown in FIG. 2, the substrate 100 treated with oxygen plasma is submerged into a solution in which a positively-charged first electrolyte 110 is dissolved. Afterwards, the substrate 100 is rinsed with deionized water. At this time, the first electrolyte 110 can be implemented as an organic material that dissolves into a water solution. According to an embodiment of the present invention, the first electrode 110 can be implemented as polyallylamine hydrochloride (PAH) having the chemical structure shown in the part (a) of FIG. 9.

Figure 3:
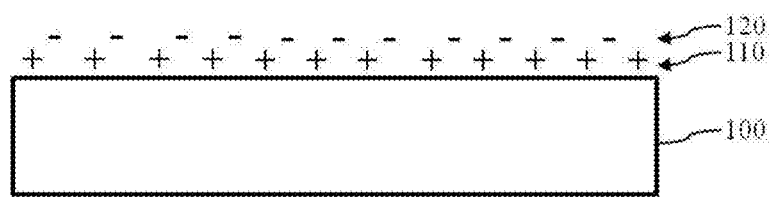

In sequence, as shown in FIG. 3, the substrate 100 is submerged again into a solution in which a negatively-charged second electrolyte 120 is dissolved. Afterwards, the substrate 100 is rinsed with deionized water. At this time, the second electrolyte 120 can be implemented as an organic material that dissolves into a water solution like the first electrolyte 110. In particular, the second electrolyte 120 can be implemented as a polystyrene sulfonate (PSS) having the chemical structure shown in the part (b) of FIG. 9.

Figure 4:
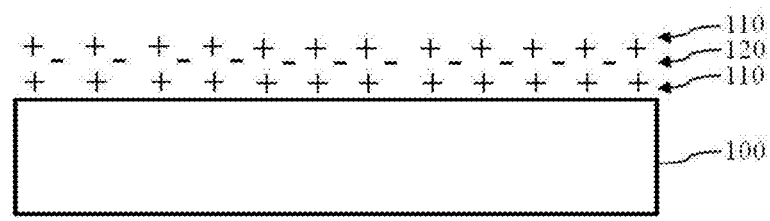

After that, as shown in FIG. 4, the substrate 100 is submerged again into the solution in which a positively-charged third electrolyte is dissolved. As shown in FIG. 4, the third electrolyte may be the same material as the first electrolyte. The substrate 100 is then rinsed with deionized water, followed by drying. In this case, the first electrolyte 110 and the second electrolyte 120 can be prepared by being dissolved in a NaCl solution.

As in this embodiment of the present invention, the oppositely-charged electrolyte solutions are alternately used in order to uniformly and randomly distribute a monolayer of nano-particles (130 in FIG. 5) which are to be adsorbed on the surface of the substrate 100 in the subsequent process.

Figure 5:
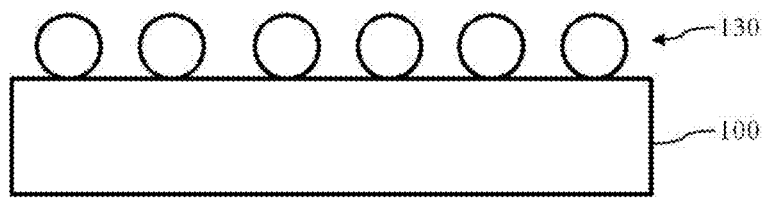

After that, as shown in FIG. 5, nano-particles 130 are adsorbed by electrostatic attractive force on the surface of the substrate 100 which is imparted with electrostatic force due to the above-described electrolyte treatment. According to an embodiment of the present invention, the nano-particles 130 can be implemented as one of oxide-based materials, such as $SiO_2$, $TiO_2$ or $Nb_2O_3$, or a polymeric material such as polystyrene (PS).

Figure 10:
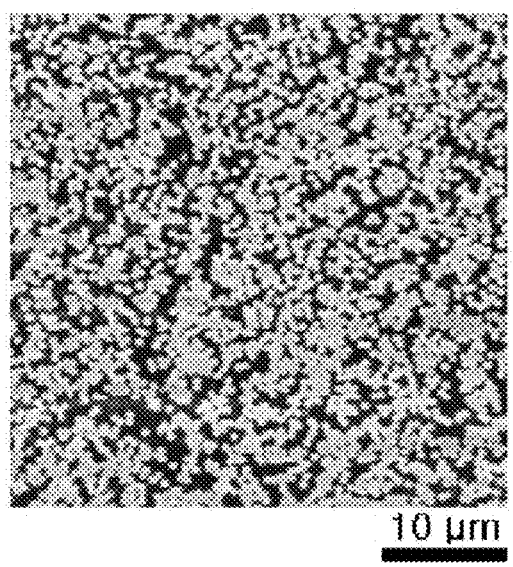
FIG. 10 shows an image of the distribution of silica nanoparticles in the method of fabricating a patterned substrate according to an embodiment of the present invention.

For instance, when the nano-particles 130 are made of $SiO_2$, the process of making the nano-particles 130 be adsorbed includes, first, submerging the substrate 100 treated with electrolytes into a solution in which the nano-particles 130 having a diameter of about 500 nm are dispersed, and then, maintaining the substrate 100 in the solution for about 30 minutes to about 1 hour. At this time, the nano-particles 130 are adsorbed on the surface of the substrate 100 by electrostatic attractive force, and as shown in FIG. 10, are randomly distributed. Here, the concentration of the nano-particles 130 adsorbed on the substrate 100 is determined by the molar concentration of a NaCl solution in which each of the first electrolyte 110 and the second electrolyte 120 is dissolved.

After that, the substrate 100 is taken out of the solution, and is sufficiently dried at a temperature of about 100° C.

Figure 6:
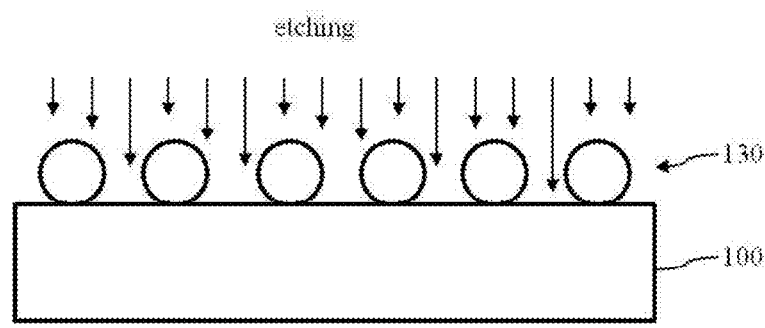
Figure 7:
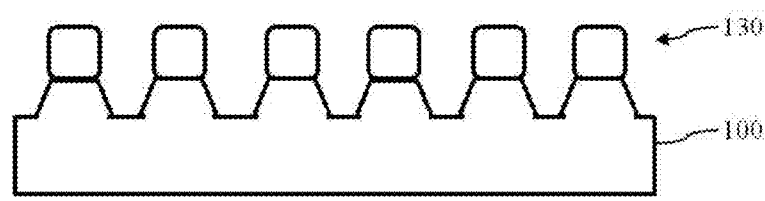
Figure 8:
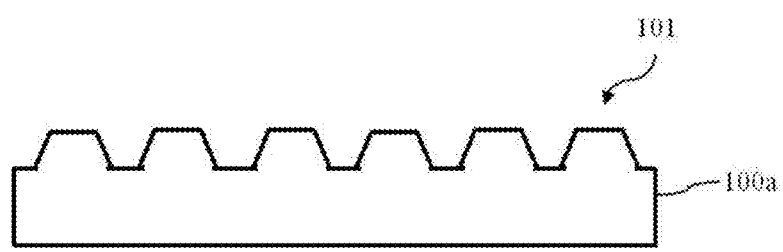
Figure 11:
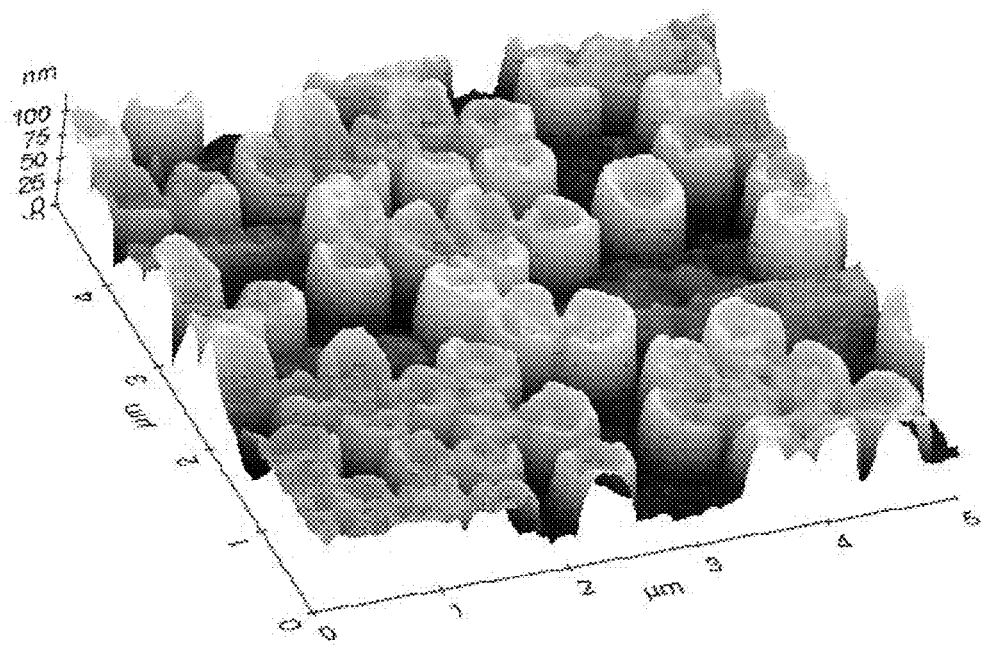
FIG. 11 shows an image of the surface of a patterned substrate in the method of fabricating a patterned substrate according to an embodiment of the present invention.

In sequence, as shown in FIG. 6 and FIG. 7, the surface of the substrate 100 is etched by an etching process using the nano-particles 130 as an etching mask, and after the etching process, the nano-particles 130 residing on the surface of the substrate 100 are removed, thereby producing a patterned substrate 100a, as shown in FIG. 8 and FIG. 11. The patterned substrate 100a has a nano- and micro-scale concave-convex structure 101, i.e. a nano- and micro-scale random pattern, on the surface. Here, when the substrate 100 is implemented as a TCO substrate, etching can be performed by reactive ion etching (RIE). An etching gas is implemented as an $Ar/O_2$ mixture gas. In addition, when the substrate 100 is implemented as a sapphire substrate or a GaN substrate, etching is required to be performed by inductively coupled plasma (ICP). At this time, an etching gas can be implemented as $BCl_4$. In addition, when the substrate 100 is implemented as a glass substrate, etching can be performed by RIE or the like when the TCO substrate is used. In this case, it is possible to improve etching efficiency when $CF_4$ is used as an etching gas.

Since the charge of the electrolytes that cause the attractive force between the nano-particles 130 and the substrate 100 is very small, the silica nano-particles 130 can be easily removed from the surface of the substrate 100 by ultrasonic waves, physically stirring, rubbing or the like.

Figure 12:
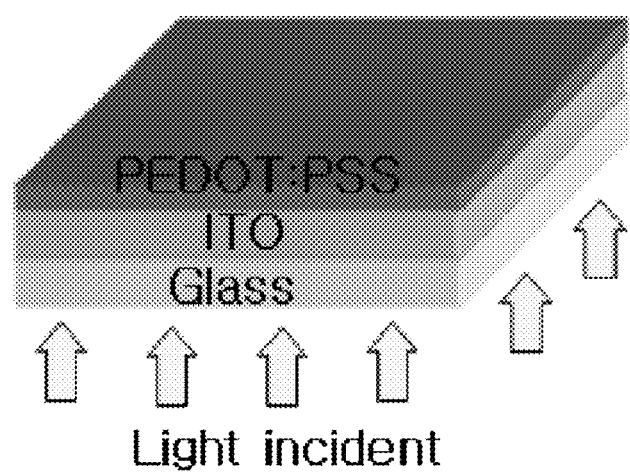
FIG. 12 is a schematic view showing a configuration intended to measure the indirect light efficiency of a patterned substrate that is fabricated by the method of fabricating a patterned substrate according to an embodiment of the present invention.

According to an embodiment of the present invention, the reflectance was measured on the assumption that a reflecting layer is made of a PEDOT:PSS material, as shown in FIG. 12, in order to examine the indirect improvement in light efficiency due to the surface patterning of an ITO thin film. Referring to the wavelength-reflectance variation graph in FIG. 13, it was observed that the reflectance of non-patterned ITO (Ref. ITO) gradually decreased depending on the etching depth within the visible wavelength range. In particular, the reflectance of the ITO was measured to be lowest at an etching depth of 60 nm. The low reflectance indicates that a large quantity of light exited outward through the PEDOT:PSS material, and that a greater amount of light is transferred to a light-absorbing layer of an organic solar cell when the ITO thin film is applied for a transparent electrode of an organic solar cell.

Figure 14:
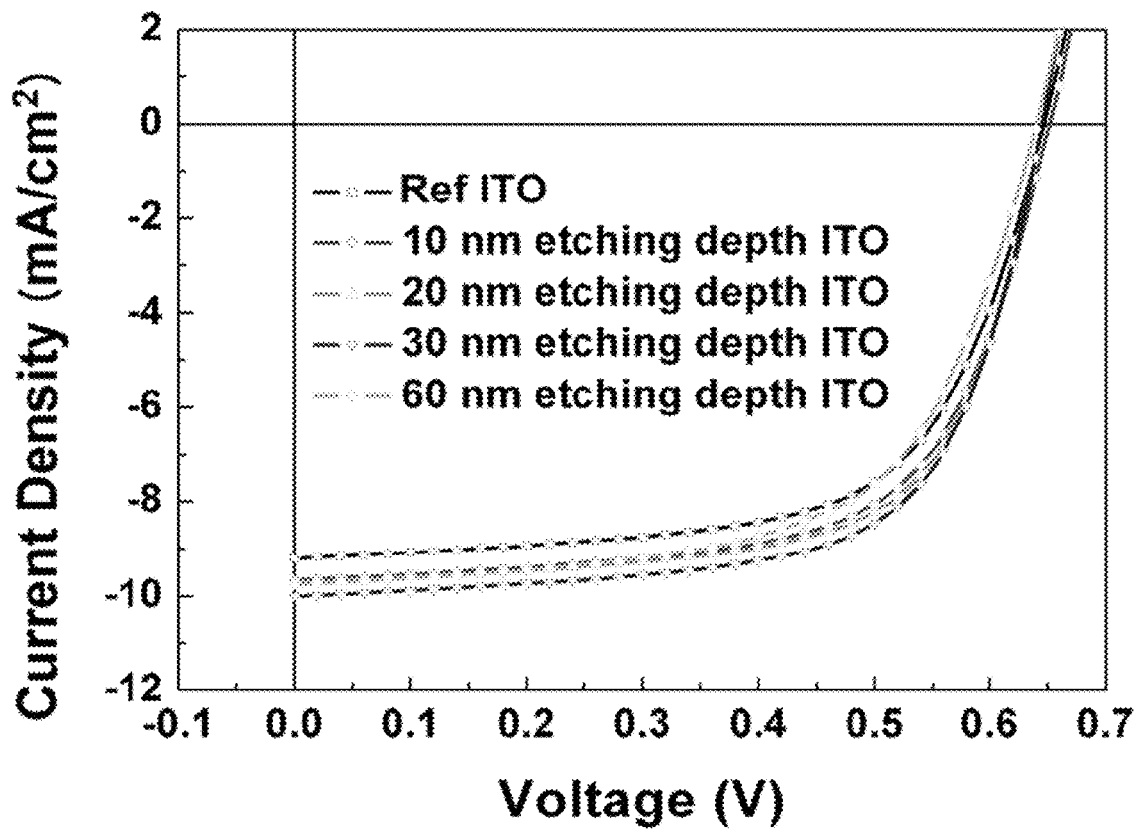
FIG. 14 is a graph showing current-voltage variations depending on the etching depth of the patterned substrates that are fabricated by the method of fabricating a patterned substrate according to an embodiment of the present invention.

In addition, FIG. 14 is a graph showing the power conversion efficiency depending on the etching depth of ITO. It was concluded that the efficiency of patterned ITO was better than that of non-patterned ITO (Ref. ITO) and the efficiency was best at an etching depth of 30 nm. Referring to the graph, it can be appreciated that an open-circuit voltage $V_{oc}$ is about 0.58 eV, which is identical to all samples, but a short-circuit current differs depending on the etching depth of the ITO surface. This indicates that more light entered the light-absorbing layer and was converted into electricity when the ITO was more deeply etched in the depth direction from the ITO surface.

Figure 13:
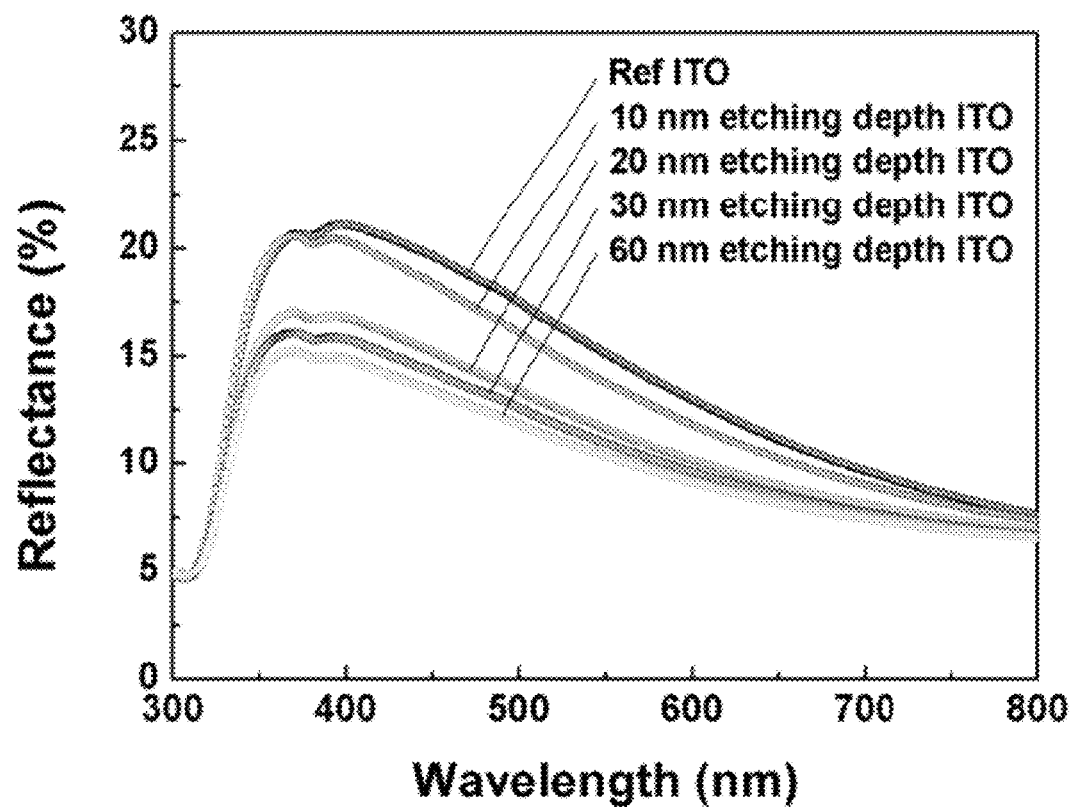
FIG. 13 is a graph showing wavelength-reflectance variations depending on the etching depth of the patterned substrates having the configuration shown in FIG. 12.

Furthermore, comparing the reflectance in FIG. 13 with the photoelectric conversion efficiency in FIG. 14, the linear relationship between the reflectance and the photoelectric conversion efficiency is not established at an etching depth of 30 nm or greater. This is because the thickness of the hole transport layer of the light-absorbing layer is about 30 nm, and in an organic solar cell having an etching depth of 30 nm or greater, there is a high possibility that the light-absorbing layer of the organic solar cell and the ITO thin film directly adjoin to each other, thereby obstructing any improvement in the device performance.

Based on the experimental analysis above, when the concave-convex structure having a random distribution is formed on the surface of the ITO coating on the glass substrate according to an embodiment of the present invention, more light can exit when passing through the interface between media having different refractive indices. It is therefore possible to improve light efficiency when the patterned substrate is applied for a transparent electrode of an organic solar cell. The patterned substrate can also be applied for a light extraction substrate in order to improve the light efficiency of an organic light-emitting device.

Figure 15:
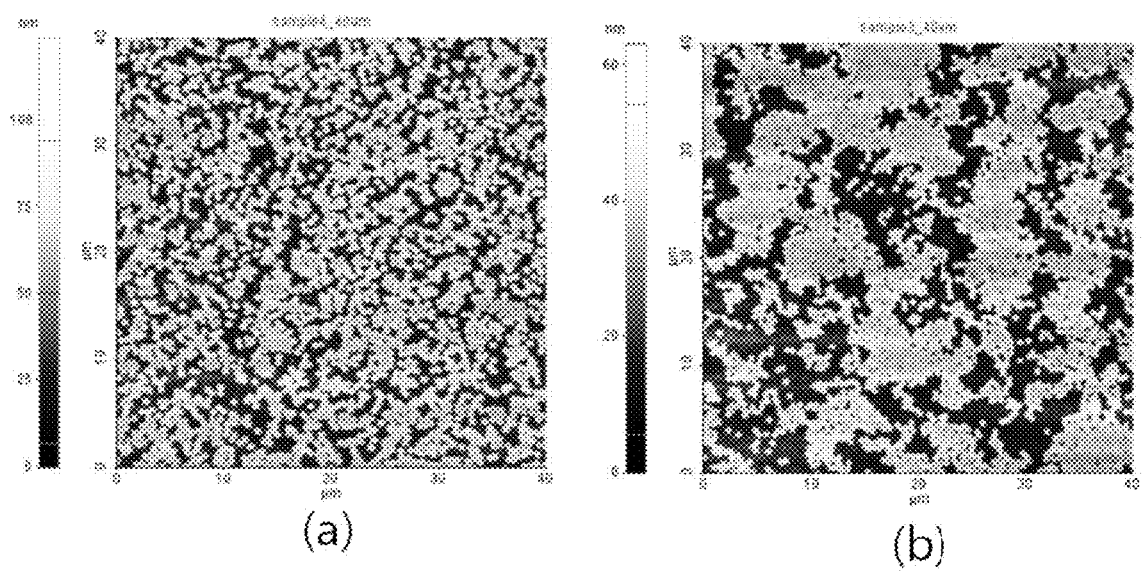
FIG. 15 is atomic force microscopy (AFM) images showing the surface of a patterned substrate that is fabricated by the method of fabricating a patterned substrate according to an embodiment of the present invention and the surface of a patterned substrate that is fabricated by a comparative example.

FIG. 15 are atomic force microscopy (AFM) images showing the surface of an ITO thin film that was treated with electrolytes a plurality of times and then etched according to an embodiment of the present invention and the surface of an ITO thin film of a comparative example that was treated with electrolytes one time and then etched. It is concluded that the ITO thin film (a) that was treated with electrolytes a plurality of times had a more uniform structure than the ITO film of the comparative example (b). It was observed that the ITO thin film of the comparative example (b) had a non-uniform surface state and that the etched surface areas were partially clustered.

Table 1 below presents factors related to measurement of the photoelectric conversion efficiency of the present invention.

TABLE 1

| | Ref | 10 nm etched ITO | 20 nm etched ITO | 30 nm etched ITO | 60 nm etched ITO |
|---|---|---|---|---|---|
| Etching depth (nm) | 0 | 10 | 20 | 30 | 60 |
| Sheet resistance ($\Omega/cm^2$) | 7.80 | 7.89 | 7.93 | 8.24 | 8.57 |
| $J_{sc}$ (mA/cm$^2$) | 9.19 | 9.61 | 9.67 | 9.99 | 9.72 |
| $V_{oc}$ (V) | 0.648 | 0.652 | 0.644 | 0.644 | 0.640 |
| FF (%) | 64.5 | 63.3 | 66.5 | 66.0 | 61.4 |
| Efficiency (%) | 3.80 | 4.03 | 4.12 | 4.23 | 3.83 |

Referring to Table 1, sheet resistance increases very slightly with the increasing etching depth. The entire efficiency was highest when the etching depth is 30 nm. In contrast, when the etching depth is deeper, efficiency is decreased.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A method of fabricating a patterned substrate of a photovoltaic cell or an organic light emitting diode, the method comprising:

generating electrostatic force on a surface of a substrate by treating the substrate with electrolytes;

causing nano-particles to be adsorbed on the surface of the substrate;

etching the surface of the substrate using the nano-particles as an etching mask; and removing the nano-particles residing on the surface of the substrate.

2. The method of claim 1, wherein treating the substrate with the electrolytes comprises:

a first step of submerging the substrate into a solution in which a positively-charged first electrolyte is dissolved and then rinsing the substrate;

after the first step, a second step of submerging the substrate into a solution in which a negatively-charged second electrolyte is dissolved and then rinsing the substrate; and after the second step, a third step of submerging the substrate into a solution in which the positively-charged third electrolyte is dissolved and then rinsing the substrate.

3. The method of claim 2, wherein each of the first electrolyte, the second electrolyte and the third electrolyte comprises an organic material that dissolves into a water solution.

4. The method of claim 3, wherein each of the first electrolyte and the third electrolyte comprises polyallylamine hydrochloride (PAH), and the second electrolyte comprises polystyrene sulfonate (PSS).

5. The method of claim 4, wherein the first electrolyte, the second electrolyte and the third electrolyte are dissolved in a NaCl solution.

6. The method of claim 2, wherein treating the substrate with the electrolyte further comprises a fourth step of drying the substrate after the third step.

7. The method of claim 1, wherein causing the nano-particles to be adsorbed comprises:

submerging the substrate into a solution in which the nano-particles are dispersed; and taking the substrate out of the solution and drying the substrate.

8. The method of claim 1, wherein the nano-particles comprise one of oxide-based materials which comprise $SiO_2$, $TiO_2$ and $Nb_2O_3$, or a polymeric material.

9. The method of claim 1, wherein the surface of the substrate is treated with oxygen plasma before generating the electrostatic force.

10. The method of claim 1, wherein the substrate comprises one selected from the group consisting of a TCO (transparent conductive oxide) substrate, a sapphire substrate, a gallium nitride substrate and a glass substrate.

11. The method of fabricating a photovoltaic cell comprising forming a pattern on a surface of at least one of an electrode substrate and a glass substrate of the photovoltaic cell using the method as recited in claim 1.

12. The method of fabricating an organic light emitting diode comprising forming a pattern on a surface of at least one of a glass substrate, an internal light extraction substrate and an external light extraction substrate of the organic light emitting diode using the method as recited in claim 1.

* * * * *